United States Patent [19]

Shinohara et al.

[11] Patent Number: 5,086,326
[45] Date of Patent: Feb. 4, 1992

[54] PHOTOELECTRIC CONVERSION DEVICE

[75] Inventors: Mahito Shinohara, Tokyo; Takao Yonehara, Atsugi, both of Japan

[73] Assignee: Canon Kabushiki Kaisha, Tokyo, Japan

[21] Appl. No.: 662,320

[22] Filed: Feb. 22, 1991

Related U.S. Application Data

[63] Continuation of Ser. No. 357,948, May 30, 1989, abandoned, which is a continuation of Ser. No. 68,194, Jun. 30, 1987, abandoned.

[30] Foreign Application Priority Data

Jul. 11, 1986 [JP] Japan .................. 61-162127

[51] Int. Cl.⁵ .................. H01L 31/10; H01L 29/72
[52] U.S. Cl. .................. 357/30; 357/34; 357/4
[58] Field of Search .................. 357/30, 34, 4

[56] References Cited

U.S. PATENT DOCUMENTS

| 4,346,395 | 8/1982 | Ouchi .................. 357/4 |
| 4,471,371 | 9/1984 | Hamano .................. 357/30 |
| 4,686,554 | 8/1987 | Ohmi et al. .................. 357/30 |
| 4,763,183 | 8/1988 | Ng et al. .................. 357/4 |

FOREIGN PATENT DOCUMENTS

| 0080652 | 11/1982 | European Pat. Off. .......... 357/23.7 |
| 0132076 | 1/1985 | European Pat. Off. .......... 357/30 |
| 0147151 | 7/1985 | European Pat. Off. .......... 357/59 |
| 2044996 | 10/1980 | United Kingdom .......... 357/30 |

Primary Examiner—Jerome Jackson, Jr.
Attorney, Agent, or Firm—Fitzpatrick, Cella, Harper & Scinto

[57] ABSTRACT

A photoelectric conversion device having a transistor made of a main electrode region of a first conductivity type and a control electrode region of a second conductivity type opposite to the first conductive type; and a capacitor in a floating condition for controlling the potential of the control electrode region; the photoelectric conversion device operating to store light-induced carriers in the control electrode region, read the stored voltage and refresh the stored carriers; and wherein the photoelectric conversion device is formed to have a multilayer structure such that at least the capacitor for controlling the potential of the control electrode region is formed under a photoelectric conversion region where the carriers are light-induced.

30 Claims, 11 Drawing Sheets

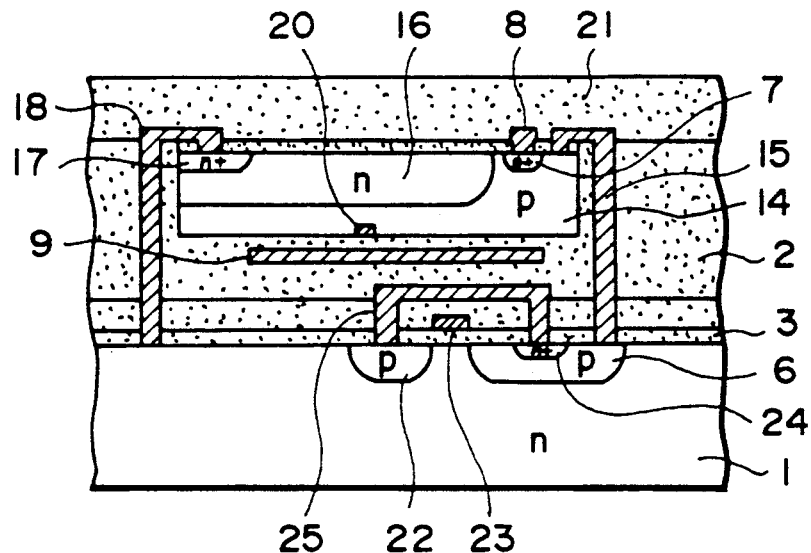
F I G. 3A
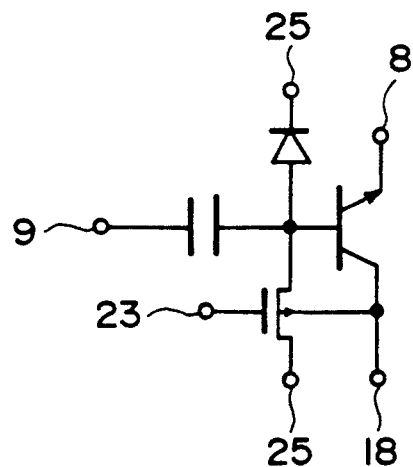
F I G. 3B

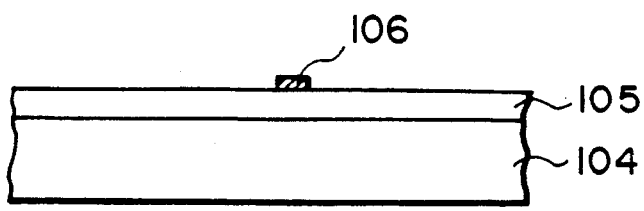
F I G. 7A
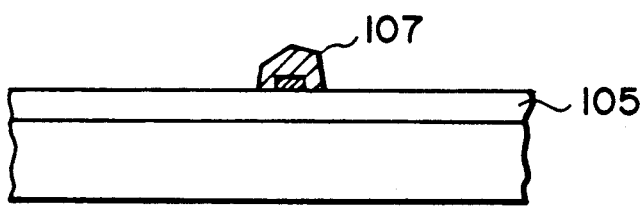
F I G. 7B
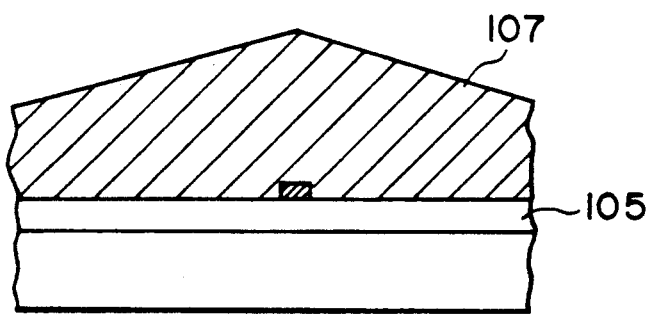
F I G. 7C
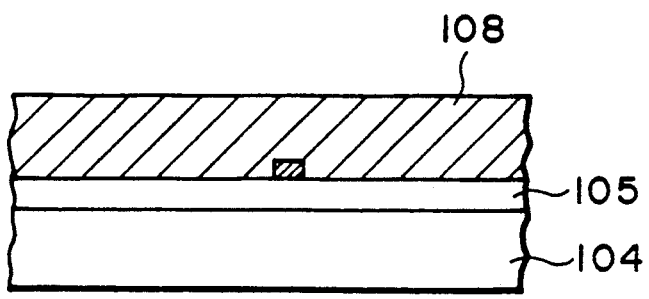
F I G. 7D

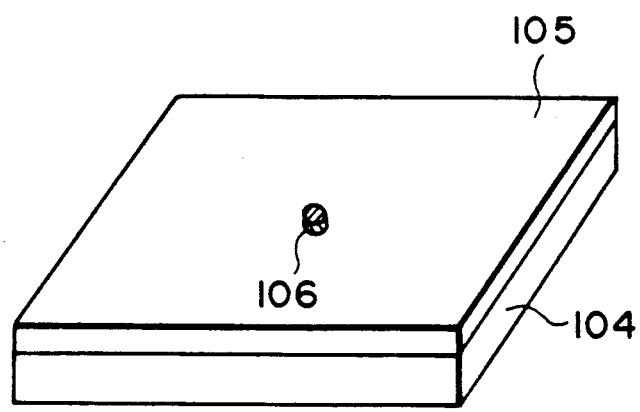
F I G. 8A
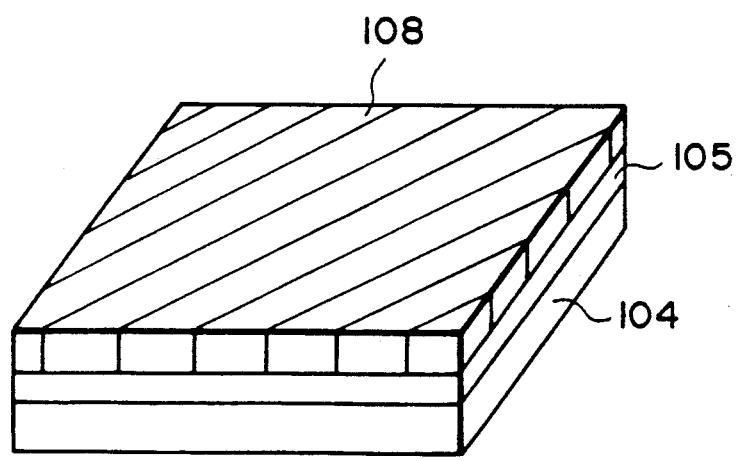
F I G. 8B

PHOTOELECTRIC CONVERSION DEVICE

This application is a continuation of application Ser. No. 07/357,948 filed May 30, 1989, now abandoned which is a continuation of Ser. No. 07/068,194, filed June 30, 1987 now abandoned.

BACKGROUND OF THE INVENTION

1. Field of the Invention

The present invention relates to a photoelectric conversion device having a photoelectric charge storage region whose potential is controlled by a capacitor.

2. Related Background Art

FIG. 1A is a plan view showing the pattern of a photoelectric conversion device described in U.S. Pat. No. 4,686,554, based on Japanese Patent Applications Nos. 120751/1983 to 120757/1983, FIG. 1B is a sectional view along line A-A' of FIG. 1A, and FIG. 1C is an equivalent circuit of a photosensor cell of the photoelectric conversion device.

Each photosensor cell of the photoelectric conversion device is constructed of insulation films 2 and 3 such as $SiO_2$ formed on an n-type silicon substrate 1; an isolation region 4 for electrically isolating each photosensor cell; an $n^-$-region 5 of low impurity concentration formed by the epitaxy method or the like; a p-region 6 serving as a bipolar transistor base; an $n^+$-region 7 serving as an emitter; an interconnection 8 made of conductive material such as Al and connected to the $n^+$-region 7 at a contact 19 for reading a signal to the external circuit; a capacitor electrode 9 facing the p-region 6 with the insulation film 3 interposed therebetween for controlling the potential of the p-region 6 under floating condition; an interconnection 10 connected to the capacitor electrode 9; an $n^+$-region 11 formed on the back of the substrate 1 to provide ohmic contact the substrate 1; and an electrode 12 for supplying a collector potential of the transistor.

Referring to the equivalent circuit shown in FIG. 1C, the capacitor $C_{ox}$ 13 is made of a MOS structure having the electrode 9, insulation film 3 and p-region 6. The bipolar transistor 14 is constructed of the emitter n-region 7, base p-region 6, collector $n^-$-region 5 and substrate 1.

The fundamental operations include storage, read and refresh operations.

First, the p-base region 6 at a negative potential is floated so that the holes of light-induced electron/hole pairs are stored in the p-base region 6 (storage operation).

Next, a positive read pulse is applied to the capacitor electrode 9 to raise the potential of the p-base region 6 and forward bias the emitter-base junction so that a storage voltage generated by the stored holes is read to the emitter electrode 8 in a floating condition (read operation).

The holes stored in the p-base region 6 are moved toward the emitter by grounding the emitter electrode 8 and applying a positive refresh pulse to the capacitor electrode 9 (refresh operation). After the stored holes are removed from the emitter, the p-base region 6 takes an initial negative potential at the trailing edge of the positive refresh pulse. The above storage, read and refresh operations are repeated thereafter.

The conventional photoelectric conversion device has the emitter and capacitor electrodes 8 and 9 formed on the light receiving side, thereby blocking a portion of the light receiving surface. Therefore, a problem arises that the more the photosensor cell is made small, the more the aperture size becomes small.

SUMMARY OF THE INVENTION

It is an object of the present invention to solve the above problem and provide a photoelectric conversion device comprising a transistor made of a main electrode region of a first conductive type and a control electrode region of a second conductive type opposite to said first conductive type and a capacitor in floating condition for controlling the potential of said control electrode region, said photoelectric conversion device operating to store light-induced carriers in said control electrode region, read the stored voltage and refresh the stored carriers, and wherein said photoelectric conversion device is formed to have a multilayer structure such that at least said capacitor for controlling the potential of said control electrode region is formed under a photoelectric region where said carriers are light-induced.

Since the capacitor for controlling the potential of the control electrode region is formed under the photoelectric conversion region, the light-shielding area of the light receiving surface becomes smaller than that of a conventional one, to thereby make the aperture size large.

BRIEF DESCRIPTION OF THE DRAWINGS

FIG. 3A is a sectional view of another embodiment of the photoelectric conversion device according to the present invention;

FIG. 3B is an equivalent circuit of a photosensor cell of the photoelectric conversion device of FIG. 3A;

FIGS. 7A to 7D show an example of processes of the monocrystal silicon forming method;

FIGS. 8A and 8B are perspective views of FIGS. 7A and 7B, respectively;

DETAILED DESCRIPTION OF THE PREFERRED EMBODIMENTS

The embodiments of the present invention will be described with reference to the accompanying drawings.

Figure 1A:
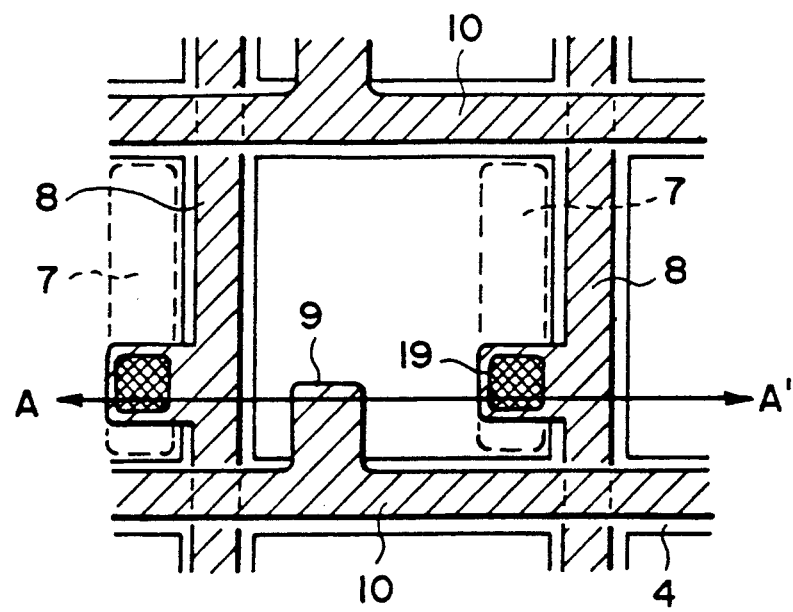
FIG. 1A is a plan view showing the pattern of a photoelectric conversion device described in U.S. Pat. No. 4,686,554, based on Japanese Patent Applications Nos. 120751/1983 to 120757/1983.
Figure 1B:
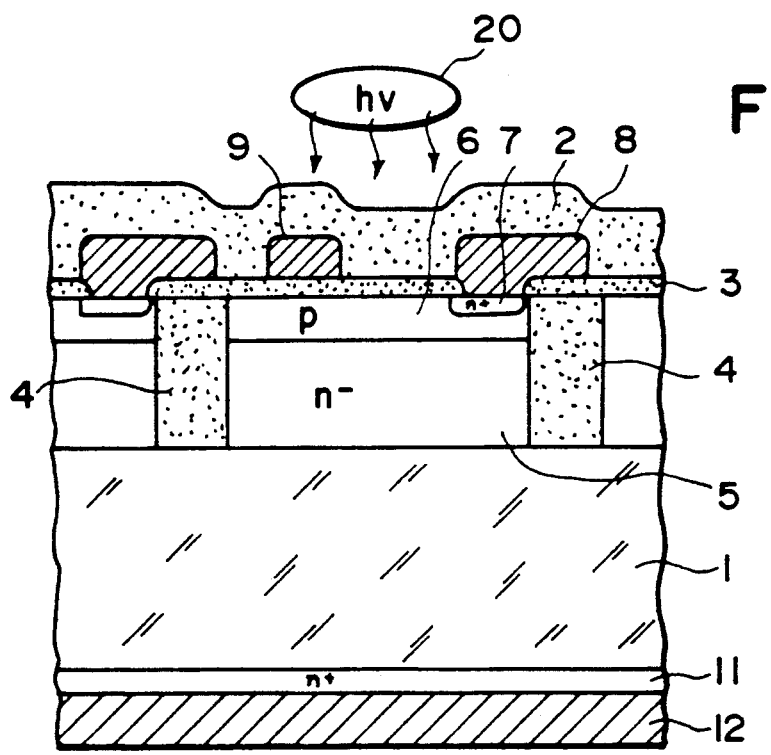
FIG. 1B is a sectional view along line A-A' of FIG. 1A.
Figure 1C:
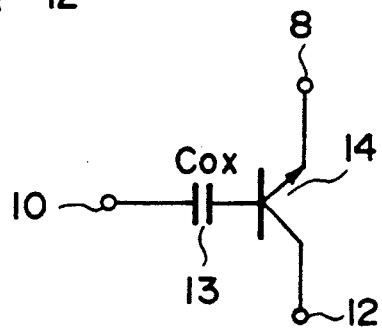
FIG. 1C is an equivalent circuit of a photosensor cell of the photoelectric conversion device.
Figure 2A:
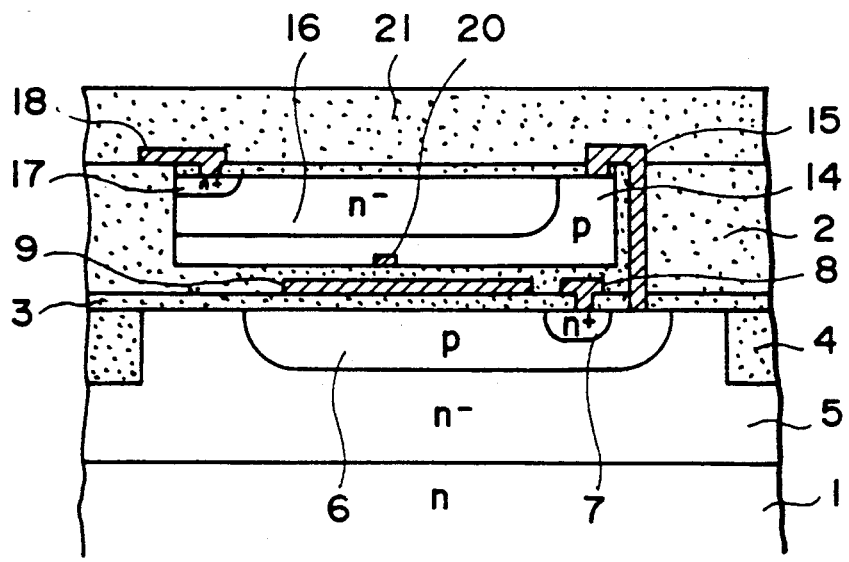
FIG. 2A is a sectional view of an embodiment of the photoelectric conversion device according to the present invention.
Figure 2B:
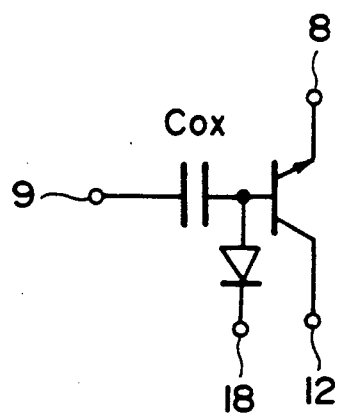
FIG. 2B is an equivalent circuit of a photosensor cell of the photoelectric conversion device of FIG. 2A.

FIG. 2A is a sectional view of an embodiment of the photoelectric conversion device according to the present invention, and FIG. 2B is an equivalent circuit of a photosensor cell of the photoelectric conversion device of FIG. 2A. Those elements having the same function as that of a conventional element shown in FIG. 1 are represented by identical reference numbers.

Referring to FIG. 2, an $n^-$-epitaxial layer 5 is formed on an n-substrate 1. A p-base region 6 is formed in the $n^-$-layer 5 and surrounded by an isolation region 4. An $n^+$-emitter region 7 is formed in the p-base region 6 and connected to an emitter electrode 8.

An insulation layer 3 is formed on the $n^-$-epitaxial layer 5. A capacitor electrode 9 facing the p-base region 6 is formed on the insulation layer 3.

The bipolar transistor constructed as above forms a lower layer of the photoelectric device. An insulation layer 2 such as $SiO_2$ is formed on the higher layer. Within a recess formed in the insulation layer 2, monocrystal silicon is grown using the monocrystal grow method to be described later. A starting material for growing monocrystal is a very fine material 20 such as $Si_3N_4$ different from the insulation layer 2 material.

A p-region 14, $n^-$-region 16 and $n^+$-region 17 are formed by means of the ion implantation or diffusion method in the monocrystal silicon layer formed by the monocrystal grow method. A pn diode serving as a photoelectric region is formed by the p-region 14 and $n^-$-region 16.

The p-region 14 of the pn diode is connected to the p-region 6 of the bipolar transistor by an interconnection 15, whereas the $n^-$-region 16 is connected to an electrode 18 through an ohmic contact layer of an $n^+$-region 17. The pn diode is covered with a passivation layer 21.

The embodiment constructed as above becomes equivalent to the conventional one if the electrodes 18 and 12 are connected together. In particular, with a positive potential applied to the electrodes 18 and 12, the p-region 14 and the $n^-$-region 16, as well as the p-base region 6 and the $n^-$-region 5 are reverse biased, respectively. Therefore, if light is incident to the pn diode, electron/hole pairs are induced and the holes are stored in the p-region 14 and p-base region in a floating condition (store operation). As described previously, if the emitter electrode 8 is floated and the capacitor electrode 9 receives a positive read pulse, a read operation is performed. If the emitter electrode is grounded and the capacitor electrode 9 receives a positive refresh pulse, a refresh operation is performed.

Further, if the electrode 18 is maintained at a same potential as of the collector electrode 12 during a read operation, and maintained at a ground potential or some proper potential during the other operations, excessively stored charges are automatically removed. Particularly, by setting the potential of the electrode 18 such that the pn diode is forward biased when strong light is incident to the pn diode and the potential of the p-region 14 and p-base region 6 becomes too high, it is possible to remove excessively stored holes in the p-region 14 and p-base region 6. Smear or blooming can effectively be avoided when an area sensor is used.

According to the embodiment, the photoelectric region is formed as an upper layer, while the capacitor electrode for controlling the base potential is formed as a lower layer. Therefore, the aperture size of a photosensor cell is made large.

Further, since the photosensor cells are isolated from each other by the insulation layer 2, leakage of light-induced carriers to adjacent cells is eliminated FIG. 3A is a sectional view of another embodiment of the photoelectric conversion device according to the present invention, and FIG. 3B is an equivalent circuit of a photosensor cell of the photoelectric conversion device of FIG. 3A.

Referring to FIG. 3A, p-regions 6 and 22 are formed in an n-type substrate 1. An $n^+$-region 24 is formed in the p-region 6. The p-regions 6 and 22 serve as source and drain regions of a p-channel MOS transistor, respectively. The p-region 6 and $n^+$-region 24 serve as a pn diode.

A gate electrode 23 is formed on an insulation layer 3. The $n^+$-region 24 of the pn diode and the p-region 22 of the MOS transistor are connected together by an interconnection 25.

The pn diode and MOS transistor constructed as above form a lower layer on which a bipolar transistor having a photoelectric conversion region is formed with a capacitor electrode 9 and the insulation layer 3.

The monocrystal silicon formed in the recess within the insulation layer 3 will be described later. Within the monocrystal silicon, there are formed a base p-region 14, collector n-region 6, ohmic contact $n^+$region 17 and emitter $n^+$-region 7. In this embodiment, the capacitor electrode 9 is formed under the p-region 14 to control the potential of the base p-region 14. The p-region 14 is connected to the p-region 6 by an interconnection 15, while the n-type substrate 1 is connected to the collector electrode 18.

Since the photoelectric conversion region is formed as an upper layer in the above embodiments, the $n^-$-epitaxial layer 5 and the isolation region 4 are not needed, thus simplifying the processes of forming the under layer.

Next, the operation of the embodiments will be described with reference to FIG. 4.

Figure 4:
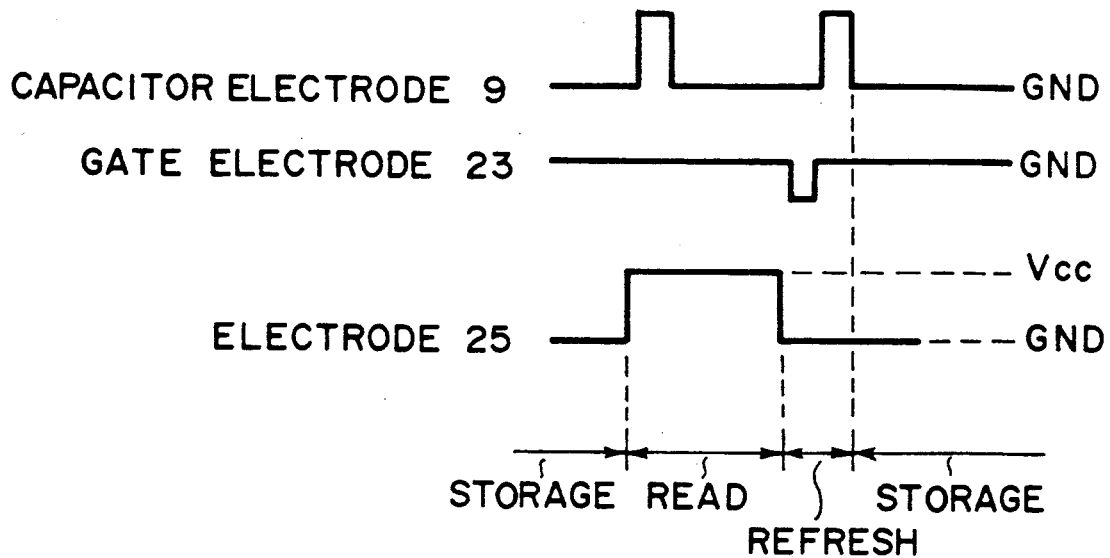
FIG. 4 is a timing chart used for explaining the operation of the embodiments.

FIG. 4 is a timing chart used for explaining the operation of the embodiments.

First, the capacitor electrode 9, gate electrode 23 and electrode 25 are grounded to store holes generated by incident light to the p-region 14. In this case, if excessive holes are stored because of strong light, the p-region 6 having a same potential as that of the p-region 14 is forward biased relative the $n^+$-region 24 so that the excessive holes are removed from the grounded electrode 25. The MOS transistor is being turned off while the gate electrode 23 is grounded.

After the store operation, the emitter electrode is floated and the electrode 25 receives a positive voltage Vcc to thereby prevent the stored charge from being removed through the pn diode. Next, a positive read pulse is applied to the capacitor electrode 9 to raise the potential of the p-region 14 and obtain a voltage corresponding to the incident light at the emitter electrode 8 (read operation).

After the read operation, the emitter electrode 8 and electrode 25 are again grounded and the gate electrode 23 is applied with a negative pulse. Then, the p-channel MOS transistor is turned on so that the potential of the p-base region 14 is maintained constant irrespective of the charge potential level of the p-base region 14. Next, the capacitor electrode 9 made a positive refresh pulse to remove residual charge of the p-base region 14 via the emitter electrode 8 (refresh operation). As above, after making the p-base region 14 to have a constant potential, a positive refresh pulse is applied. As a result, the residual charge is removed rapidly to enable a high speed operation.

Next, the monocrystal grow method for growing monocrystal silicon in the recess within the insulation layer 2 will be described in detail.

First, the selective deposition method for selectively depositing a film on a deposition surface will be described. By the selective deposition method, a thin film is selectively formed on a substrate utilizing the differences in substrate materials each having a different factor which influences the nucleus forming during the thin film forming processes. Such a factor includes a surface energy, attachment coefficient, desorption coefficient, surface diffusion rate and so on.

Figure 5A:
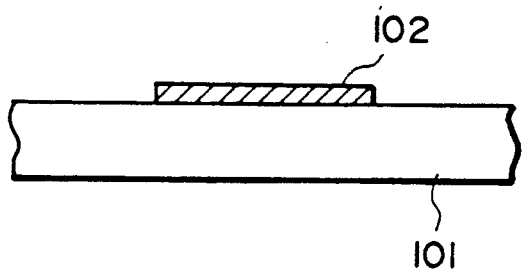
FIGS. 5A and 5B are views used for explaining the selective deposition method.
Figure 5B:
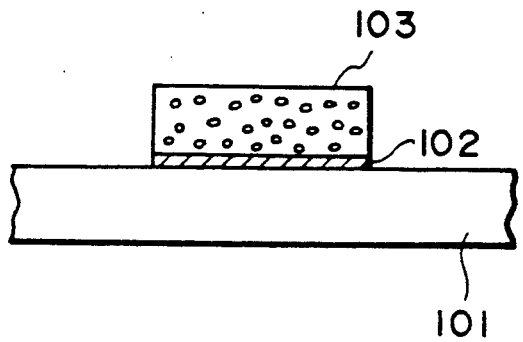

FIGS. 5A and 5B illustrate the selective deposition method. As shown in FIG. 5A, thin film 102 is formed at a desired portion of a substrate 101, the thin film having a different factor from that of the substrate. Then, a thin film 103 grows only on the thin film 102 except the substrate 101 by using a suitable material under proper deposition conditions. Thus, it is possible to grow the self-aligned thin film 103 without using conventional lithography processes using resists.

Examples of materials used in the selective deposition method are $SiO_2$ as the substrate 101, Si, GaAs and silicon nitride as the thin film 2, and Si, W, GaAs and InP as the deposited thin film 103.

Figure 6:
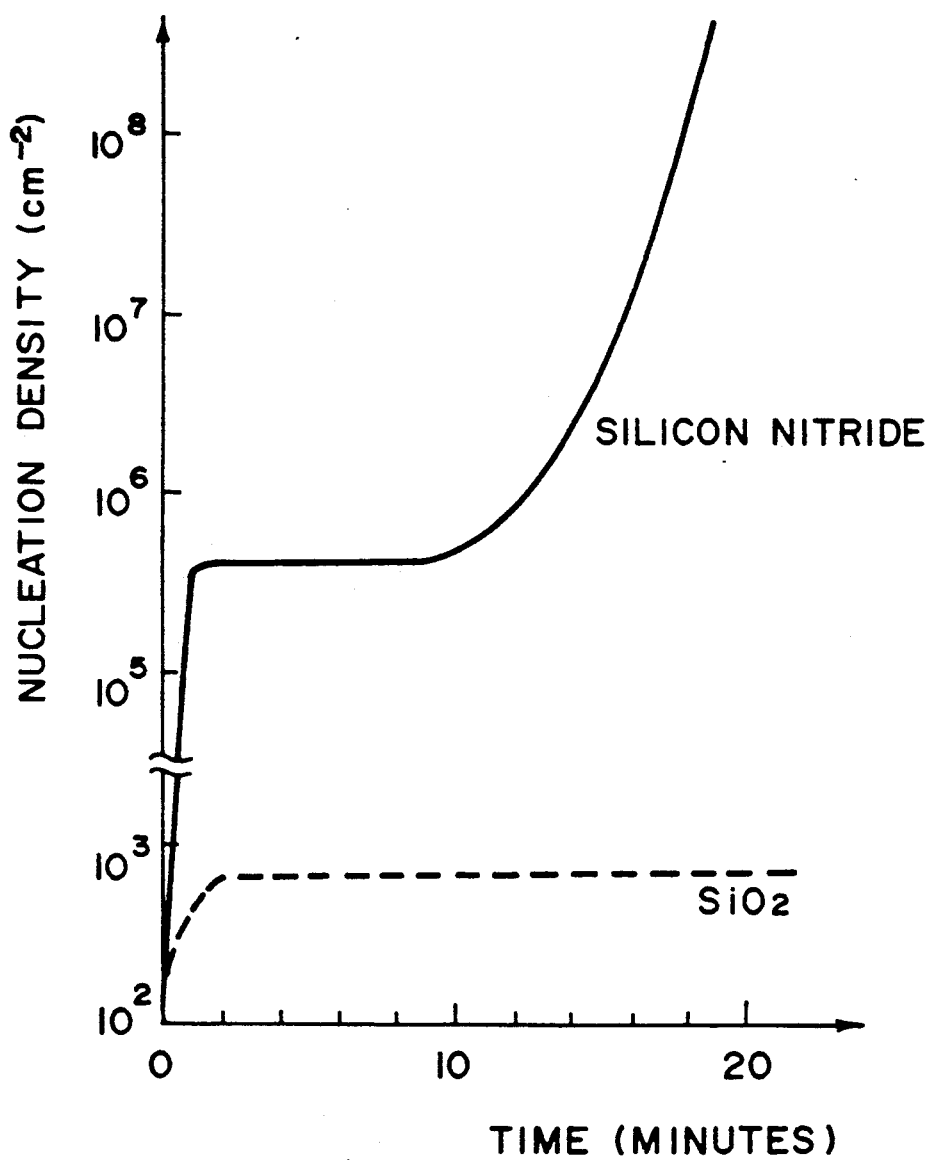
FIG. 6 is a graph showing a change in nucleation desities with time, respectively at above the deposition surfaces of $SiO_2$ and silicon nitride.

FIG. 6 is a graph showing a change with time of the nucleation densities on an $SiO_2$ deposition surface and a silicon nitride.

As seen from the graph, the nucleation density on $SiO_2$ becomes saturated soon after the start of deposition at lower than $10^3$ cm$^{-2}$ and it changes only slightly even after 20 minutes.

In contrast, the density on silicon nitride ($Si_3N_4$) becomes saturated at below $4 \times 10^5$ cm$^{-2}$ and thereafter it increases rapidly. In this measurement example, the thin film was deposited using the CVD method with $SiCl_4$ gas diluted by $H_2$ gas and under a pressure of 175 Torr and at a temperature of 1000° C. As the reactive gas, there may be used $SiH_4$, $SiH_2Cl_2$, $SiHCl_3$ or $SiF_4$ with proper pressure and temperature to obtain similar effects. The vacuum deposition method may also be used.

There is substantially no nucleation on $SiO_2$ However, if HCl gas is added to the reactive gas, the nucleation on $SiO_2$ is further suppressed to completely prohibit silicon deposition on $SiO_2$.

The above deposition is mainly dependent on the differences of attachment coefficients, deposition coefficients, surface diffusion rates and so on of the $SiO_2$ and silicon nitride deposition surfaces. However, it can be understood that the selective deposition is also caused by the fact the $SiO_2$ reacts with Si atoms to generate silicon monoxide having a high steam pressure which etches the $SiO_2$ itself, whereas this etching phenomenon does not occur on the silicon nitride (T. Yonehara, S. Yoshioka, S. Miyazawa, Journal of Applied Physics 53, p6839, 1982).

The nucleation density difference sufficiently large for selective formation of a thin film can be attained as shown in the graph, by selecting $SiO_2$ and silicon nitride as the deposition surface material and silicon as the deposition material. Although it is preferable to use $SiO_2$ as the deposition surface, the present invention is not limited thereto. But, $SiO_x$ may be used for obtaining such a nucleation density difference.

Other materials to be later described may be used for selective formation of a deposition layer if only they can exhibit a nucleation density difference by more than $10^3$ times as high as that of $SiO_2$.

An alternative method for obtaining a nucleation density difference is that ions such as Si or N are locally implanted in $SiO_2$ to form regions having excessive Si or N.

In the selective deposition method as described above, a material having a different nucleation density from that of the deposition surface is formed into a very fine size sufficient for growing only a single nucleus. By doing so, it is possible to selectively grow monocrystal on the very fine material.

Since the selective grow of monocrystal is determined by the electron state on the deposition surface, particularly on the dangling bond state, the material (e.g., $SiO_2$) with a low nucleation density is not needed to be a bulk material, but the surface of any material or substrate may be used as the deposition surface.

FIGS. 7A to 7D show an example of the processes of the monocrystal grow method, and FIGS. 8A and 8B are perspective views of the substrate shown in FIGS. 7A and 7D.

As shown in FIGS. 7A and 8A, a thin film 105 having a low nucleation density sufficient for selective deposition is formed on a substrate 104. Then, a material having a large nucleation density is deposited thinly over the thin film 105. The material is patterned by the lithography to form a very fine material 106. Any crystal structure and composition of the substrate 104 may be used. A substrate with functional elements may also be used. The very fine material 106 may include, as previously described, the affected region with excessive ions such as Si or N which are implanted in the thin film 105.

Under proper deposition conditions, a single nucleus of a thin film material is formed only on the very fine material 106. The size of the very fine material 106 may be smaller than several microns, although it depends on the material to be used. The nucleus grows while retaining a monocrystal structure to become a monocrystal grain 107 of an island shape as shown in FIG. 7B. For the formation of the monocrystal grain 107 of an island shape, it is necessary to set the deposition conditions such that nucleation does not occur on the thin film 105, as previously described.

The monocrystal grain 107 of an island shape further grows about the very fine material 106 while retaining a monocrystal structure, and covers the entirety of the thin film 105 as shown in FIG. 7C.

Next, the monocrystal grain 107 is made flat through the etching or grinding to obtain on the thin film 105 a monocrystal layer 108 in which necessary elements can be formed, as shown in FIGS. 7D and 8B.

Since the thin film 105 of the deposition surface material is formed on the substrate 104, any material may be used for the substrate 104. Further, even a substrate 104 with functional elements formed therein may be used to form a monocrystal layer thereon.

In the above embodiments, the thin film 105 is used as the deposition surface material. However, a substrate having a low nucleation material capable of the selective deposition may be used as it is to form a monocrystal layer.

EXAMPLE

An example of forming a monocrystal layer will be described.

SiO$_2$ was used as the deposition surface material of the thin film 105. A quartz substrate may be used. A substrate of metal, semiconductor, magnetic material, piezoelectric material or dielectric material may also be used on which SiO$_2$ is formed using the sputtering, CVD or vacuum deposition method. It is preferable to use SiO$_2$ as the deposition surface material. SiO$_x$ with a desired x value may also be used.

A silicon nitride layer (Si$_3$N$_4$ layer) or a polysilicon layer was deposited on the SiO$_2$ layer 105 thus formed, using the material different in nucleation density from that of SiO$_2$. The silicon nitride layer or the polysilicon layer was patterned to form a very fine material 106 smaller than several microns, preferable smaller than one micron, using the conventional lithography, or the lithography using X rays, electron beams, or ion beams.

Next, Si was selectively grown on the substrate 11 using a mixture gas of HCl and H$_2$, SiH$_2$Cl$_2$, SiCl$_4$, SiHCl$_3$, SiF$_4$ or SiH$_4$. The substrate temperature was 700° to 1100° C., and the pressure was about 100 Torr.

A monocrystal silicon grain 107 was grown for about several tens minutes about the very fine material 106 on SiO$_2$ of the silicon nitride or the polysilicon. By using optimum conditions, the size of the grain 107 grew larger than several tens microns.

Subsequently, only the silicon was etched to make the surface of the grain flat by using the reactive ion etching method which utilizes the etching speed difference between Si and SiO$_2$. Thus, a polysilicon layer was formed with the grain diameter controlled. Then, grain boundaries were removed to form a monocrystal silicon layer 108 of an island shape. In case where the surface of the monocrystal grain 107 is rugged, a mechanical grinding is performed prior to the etching.

Field effect transistors were formed in the monocrystal silicon layer 108 thus formed with the size larger than several tens microns and without any grain boundary, which showed the performance not inferior to that of those formed in a monocrystal silicon wafer.

Since the adjacent monocrystal silicon layers 108 are electrically isolated from each other by SiO$_2$. there will no mutual interference between C-MOS transistors. Further, since the thickness of an active region for functional elements is thinner than that when using a silicon wafer, malfunction due to charge in the wafer caused by radial rays can be avoided. Furthermore, since parasitic capacitance is decreased, the high speed operation of elements becomes possible. In addition, any substrate of large size can be used to form a monocrystal thereon so that the cost is reduced as compared with a silicon wafer. Still in addition, since a substrate of semiconductor, piezoelectric material, dielectric material may be used to form a monocrystal layer thereon, a three-dimensional integrated circuit with multiple functions may be realized.

COMPOSITION OF SILICON NITRIDE

Not only Si$_3$N$_4$ but also other silicon nitride with various components of Si and N may be used for obtaining a sufficient nucleation density difference between the deposition surface material and the very fine material.

Using the plasma CVD method wherein SiH$_4$ gas and NH$_3$ gas are decomposed under RF plasma at a low temperature to form a silicon nitride film, it is possible to greatly change the composition ratio of Si to N of the deposited silicon nitride film in accordance with a change in flow rates of SiH$_4$ gas and NH$_3$ gas.

Figure 9:
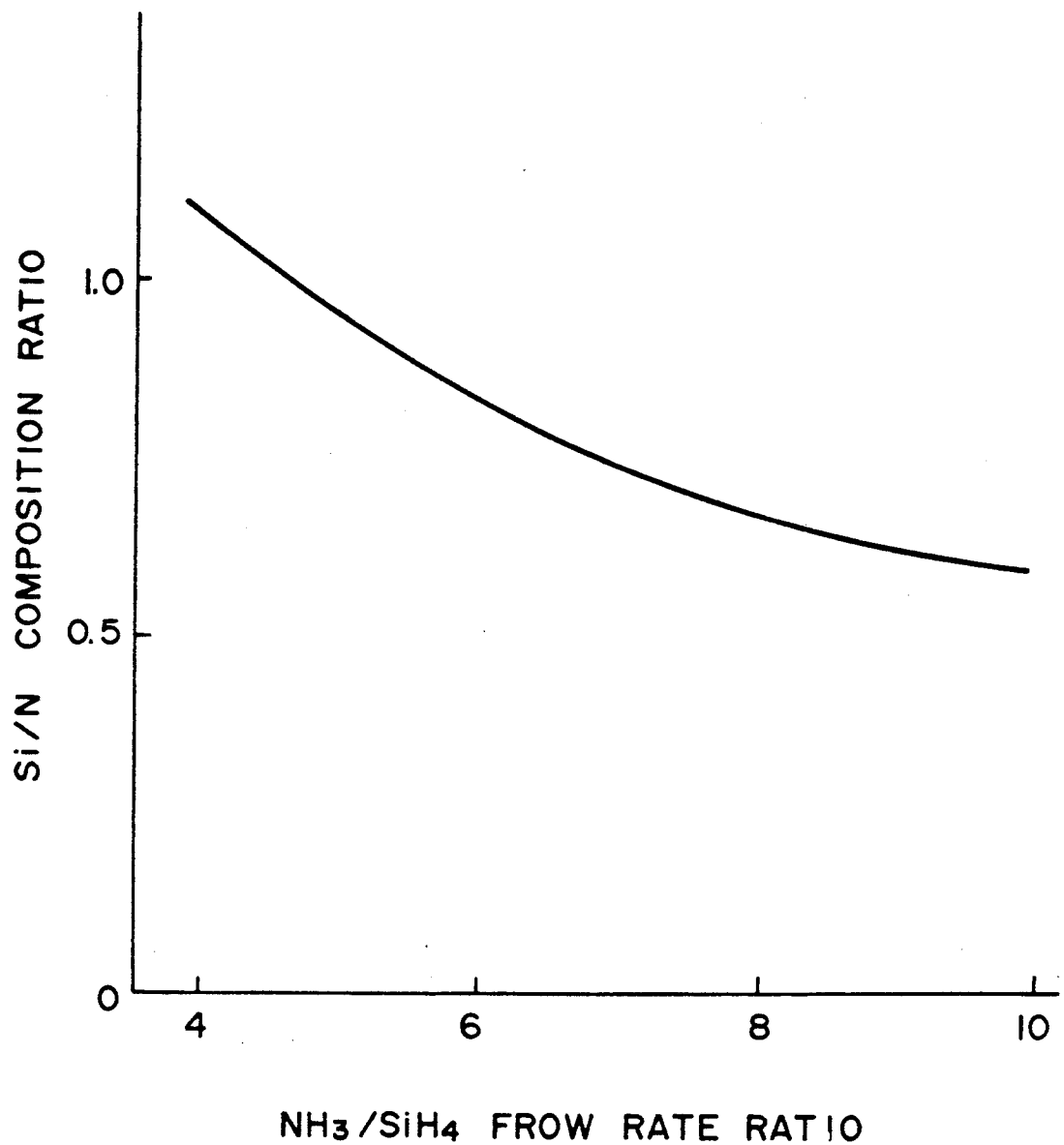
FIG. 9 is a graph showing a relation between the $NH_3/SiH_4$ flow rate ratio and the Si/N composition ratio in a silicon nitride film.

FIG. 9 is a graph showing a relation between the flow rate ratio of SiH$_4$ to NH$_3$ and the composition ratio of Si to N of the silicon nitride film.

The deposition conditions were as follows: at the RF output of 175 W and at the substrate temperature of 380° C., the flow of NH$_3$ gas was changed with the SiH$_4$ gas flow maintained fixed at 300 cc/min. As seen from the graph, as the gas flow ratio NH$_3$/SiH$_4$ changes from 4 to 10, the Si/N ratio of the silicon nitride was changed to 1.1 to 0.58, which was observed by Auger electron spectroscopy.

A silicon nitride film which was formed by using the underdiminished pressure CVD method and introducing SiH$_2$ gas and NH$_3$ gas at the diminished pressure of 0.3 Torr and at the temperature of about 800° C., showed the composition substantially near the stoichiometric ratio of Si$_3$N$_4$ (Si/N=0.75).

Further, a silicon nitride film which was formed by using the thermal nitrization method and heat treating Si at about 1200° C. in ammonium gas or N$_2$ gas, showed the composition more nearer to the stoichiometric ratio of Si$_3$N$_4$ because the process was carried under a thermal equilibrium.

A silicon nucleus was grown using a silicon nitride formed by the above methods as the deposition surface material having a larger nucleation density than that of silicon. It was confirmed that the uncleation density differed in accordance with the composition ratio.

Figure 10:
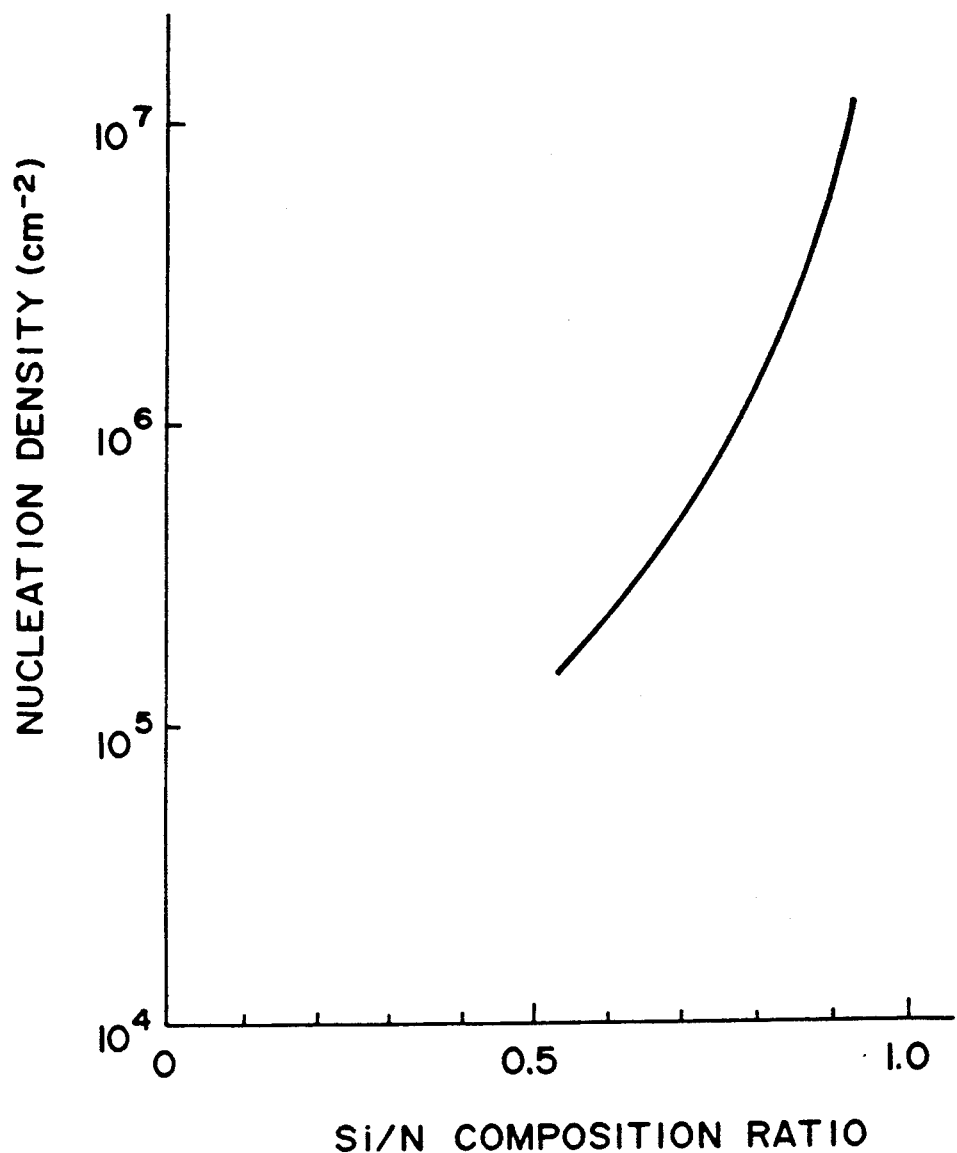
FIG. 10 is a graph showing a relation between the Si/N composition ratio and the nucleation density.

FIG. 10 is a graph showing a relation between the Si/N composition ratio and the nucleation density. As seen from the graph, by changing the composition of silicon nitride, the nucleation density of the silicon growing on the silicon nitride changed greatly. The deposition conditions were as follows; SiCl$_4$ gas was reacted with H$_2$ gas at 1000° C. at a diminished pressure of 175 Torr to form silicon.

The phenomenon that the nucleation density changes in accordance with the composition of silicon nitride influences to a large degree the size of very fine silicon nitride suitable for growing a single crystal. Particularly, silicon nitride having a large nucleation density cannot be used to form a single nucleus unless it is formed of a very fine shape.

Therefore, it is necessary to select the size of silicon nitride suitable for forming a single nucleus and select a nucleation density. For instance, under the deposition condition obtainable a nucleation density as large as $10^5$ cm$^{-2}$, silicon nitride whose size is smaller than about 4 microns can grow a single nucleus.

FORMATION OF VERY FINE MATERIAL THROUGH ION IMPLANTATION

In order to realize a nucleation density difference from that of silicon, another method may be used wherein ions such as Si, N, P, B, F, Ar, He, C, As, Ga or Ge are locally implanted in SiO$_2$ used as the deposition surface material having a low nucleation density to thereby form on the surface thereof an affected region which is used as the deposition region having a high nucleation density.

Particularly, the surface of SiO$_2$ was deposited with a resist. The resist was locally exposed, developed and dissolved to expose a desired portion of the SiO₂ surface.

Next, SiF₄ gas was used as a source gas to implant silicon ions to the SiO₂ surface at 10 K eV and at the concentration of $1 \times 10^{16}$ to $1 \times 10^{18}$ cm$^{-2}$. The implantation distance of 114 angstroms and the silicon concentration of as large as $10^{22}$ cm$^{-3}$ at the SiO₂ surface were obtained. Since SiO₂ is amorphous, the region with silicon ions implanted was also maintained amorphous.

In order to define the area of the affected region, although the ion implantation using a resist as a mask can be used, it is also possible to implant silicon ions to the SiO₂ surface by using the focussed ion beam method without using a resist mask.

After the ion implantation, the resist was removed thus to obtain the affected region with excessive silicon ions on the SiO₂ surface. Then, silicon was vapor deposited on the SiO₂ surface with the affected region.

Figure 11:
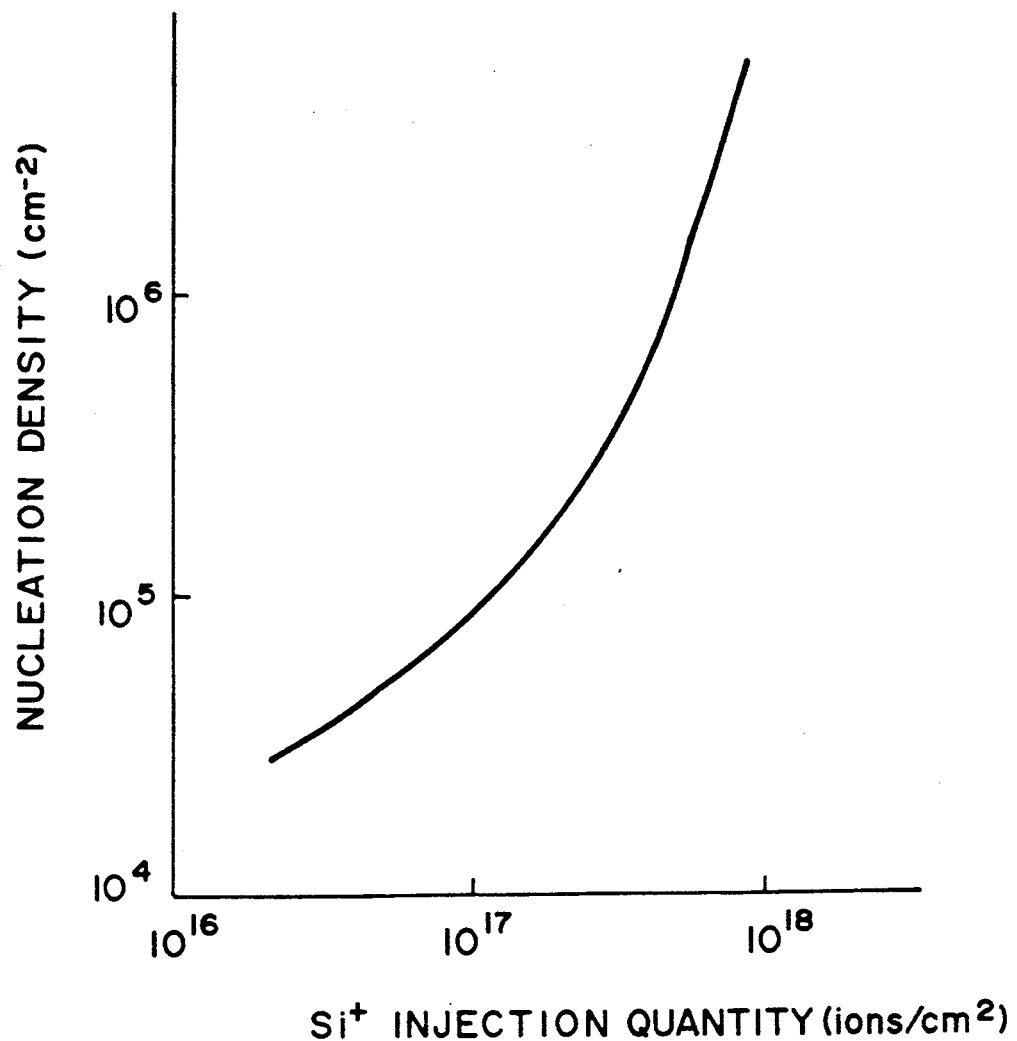
FIG. 11 is a graph showing the relation between the Si ion injection quantity and the nucleation density.

FIG. 11 is a graph showing a relation between the silicon ion injection quantity and the nucleation density.

As seen from the graph, as the silicon injection quantity increases, the nucleation density increased. Therefore, the affected region as the very fine material was used to enable the formation of a silicon single nucleus and hence a monocrystal as described previously.

In order to form a very fine affected region sufficient for forming a single nucleus, the resist patterning or the focussed ion beam may be used.

SILICON DEPOSITION METHOD OTHER THAN CVD

Instead of the CVD method, a monocrystal grow based on selective silicon nucleus formation may be realized by another method wherein silicon is evaporated under vacuum (smaller than 10$^{-6}$ Torr) using an electron gun to deposit it on a heated substrate. Particularly, in the molecular beam epitaxy method under a very high vacuum (smaller than 10$^{-9}$ Torr), it is known that a silicon beam starts reacting with SiO₂ at the substrate temperature higher than 900° C. so that the silicon nucleation on SiO₂ is completely eliminated (T. Yonehara, S. Yoshioka and S. Miyazawa, Journal of Applied Physics 53, 10, p6839, 1983).

Using the above technology, silicon single nuclei were formed with perfect selectivity on various silicon nitride formed on SiO₂ to consequently form monocrystal silicon. The deposition conditions were as follows; a vacuum lower than 10$^{-8}$ Torr, a silicon beam intensity of $9.7 \times 10^{14}$ atoms/cm² sec, and a substrate temperature of 900° to 1000° C.

In this case, a reactive product SiO having an extremely high steam pressure was formed through a reaction of SiO₂+Si 2SiO so that SiO₂ itself was etched by evaporated silicon.

In contrast, the above etching phenomenon did not occur on silicon nitride, but nuclei were formed and a monocrystal silicon was formed.

Instead of silicon nitride, tantalum oxide (Ta₂O₅), silicon nitride oxide (SiON) or others may be used as the deposition surface material having a high nucleation density to obtain similar effects. Such material formed in a very fine shape may be used to form a monocrystal silicon.

Using the monocrystal grow method described in detail as above, the monocrystal silicon in the recess of the insulation layer 2 of the above embodiments was formed.

Figure 12A:
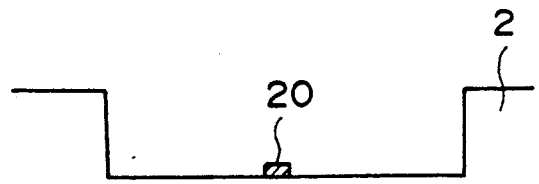
FIGS. 12A to 12C show the processes for forming monocrystal silicon of the embodiments.
Figure 12B:
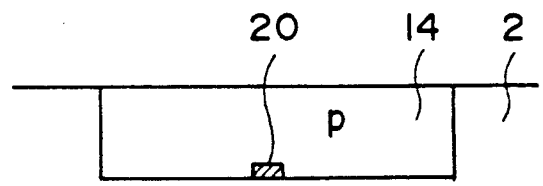
Figure 12C:
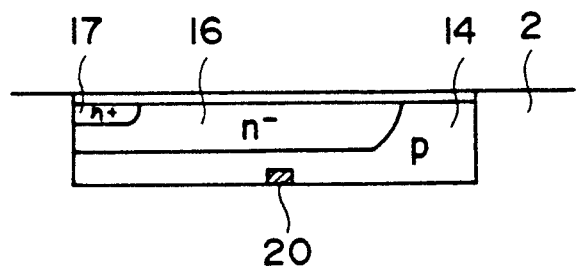

FIGS. 12A to 12C show the processes for forming monocrystal silicon of the above embodiments.

First, as shown in FIG. 12A, a recess was formed within the insulation layer 2 of SiO₂ by the etching. A very fine material (Si₃N₄) 20 different in nucleation density was formed on the recess.

Next, a monocrystal silicon was grown with p-type impurity gas to fill the recess with p-type monocrystal silicon as shown in FIG. 12B. Then, by making the surface even, the p-region 14 was formed.

Thereafter, as shown in FIG. 12C, an oxide film was formed on the surface of the p-region 14 to form n⁻-region 16 and n⁺-region 17 by the ion implanting.

As described so far in detail, according to the embodiments of the photoelectric device, a capacitor for controlling the control electrode region is formed under the photoelectric conversion region so that the light shielding portion of the light receiving surface is reduced as compared with a conventional device, to thereby make an aperture size large.

We claim:

1. A photoelectric conversion device comprising:
   a photoconversion section, wherein incident light generates electric carriers in said photoconversion section, the carriers being stored to allow generation of an output signal in accordance with the quantity of stored carriers;
   a transistor, having a control region of a first conductivity type and a main region of a second conductivity type opposite to the first; and
   switch means coupled to said control region for controlling the potential of said control region,
   wherein said device has a multilayer structure in which said switch means is provided below said photoconversion section, and wherein said switch means controls a potential of said control region by connecting said control region to a reference potential source.

2. A photoelectric conversion device according to claim 1, in which said switch means is provided below said transistor.

3. A photoelectric conversion device according to claim 1 or claim 14, in which said switch means comprises an MOS transistor.

4. A photoelectric conversion device according to claim 1, further comprising a potential control means for controlling the potential of said control region, said potential control means being below said photoconversion section.

5. A photoelectric conversion device, comprising:
   a photoconversion section, in which incident light generates electric carriers, the carriers being stored to allow generation of an output signal in accordance with the quantity of stored carriers;
   a transistor having a control region of a first conductivity type and a main region of a second conductivity type opposite to the first; and
   a diode having a first region of the first conductivity type and a second region of the second conductivity type, said first region and said control region being electrically coupled together and said second region being electrically coupled to a reference potential source during a carrier storing operation,
   wherein said photoelectric conversion device has a multilayer structure in which said diode and said transistor are arranged one below the other.

6. A photoelectric conversion device according to claim 5, in which said photoconversion section comprises the first-conductivity-type region of the higher-disposed of said diode and said transistor.

7. A photoelectric conversion device according to claim 5 or claim 18, further comprising a potential control means for controlling the potential of said control region, said potential control means being provided between said diode and said transistor.

8. A photoelectric conversion device comprising a transistor structure having a first semiconductor region of a first conductivity type, a second semiconductor region of a second conductivity type opposite to the first conductivity type, and a third semiconductor region of the second conductivity type,
   wherein said first semiconductor region stores carriers in a floating condition,
   wherein a junction between said first and second semiconductor regions is forwardly biased, so as to supply an output signal relating to an optical energy received by said photoelectric conversion device based on stored carriers, and
   wherein said first semiconductor region comprises upper and lower regions to be maintained at one potential, said upper and lower regions having laminated structure sandwiching an electrode for controlling a potential of said first semiconductor region.

9. A photoelectric conversion device according to claim 8, in which said third semiconductor region is electrically connected to said first semiconductor region.

10. A photoelectric conversion device according to claim 8, further comprising an insulating layer, said upper region being formed on said insulating layer.

11. A photoelectric conversion device according to claim 4, in which said potential control means comprises an electrode capacitively coupled to said control region.

12. A photoelectric conversion device according to claims 1 or 5, in which the output signal is provided in use by forward biasing a junction between said control region and said main region to provide a signal in accordance with charge on said control region provided by generation of carriers in said photoconversion section.

13. A photoelectric conversion device according to claims 1 or 5, in which said control region stores carriers generated at said photoconversion section.

14. A photoelectric conversion device according to claim 13, in which said control region is electrically floating while it stores the carriers.

15. A photoelectric conversion device comprising a transistor structure having a first semiconductor region of a first conductivity type, a second semiconductor region of a second conductivity type opposite to the first conductivity type, and a third semiconductor region of the second conductivity type,
   wherein said first semiconductor region stores carriers in a floating condition,
   wherein a junction between said first and second semiconductor regions is forwardly biased, so as to supply an output signal relating to a light energy received by said photoelectric conversion device based on stored carriers, and
   wherein said photoelectric conversion device comprises an upper region having a photoelectric conversion section provided with a surface for receiving light and a lower region, said upper and lower regions having laminated structure sandwiching an electrode for controlling a potential of said first semiconductor region and said electrode existing only between the upper and lower regions.

16. A photoelectric conversion device according to claims 8 or 15, in which said electrode is capacitively coupled to said first semiconductor region.

17. A photoelectric conversion device according to claim 15, in which the output signal is provided in use by forward biasing the junction between said first semiconductor region and said second semiconductor region to provide a signal in accordance with charge on said first semiconductor region provided by generation of carriers in said photoelectric conversion section.

18. A photoelectric conversion device according to claim 15, in which said first semiconductor region stores carriers generated at said photoelectric conversion section.

19. A photoelectric conversion device according to claim 18, in which said first semiconductor region is electrically floating while it stores the carriers.

20. A photoelectric conversion device according to claim 1, further comprising:
   an insulating layer which extends over said switch means and said transistor,
   wherein said photoconversion section is formed in a monocrystal grown from a nucleus produced in a nucleus-forming region on said insulation layer, said nucleus-forming region having a sufficiently small area so as to form only one nucleus to be grown into a single monocrystal through crystal growth thereon, and said nucleus-forming area being made from material different from said insulation layer, which material has a nucleus-forming density larger than that of said insulation layer.

21. A photoelectric conversion device according to claim 5,
   wherein said transistor includes a potential control means for controlling the potential of said control region,
   wherein said photoconversion section comprises said first conductivity type region of one of said transistor and said diode, and
   wherein said device further comprises:
   an insulating layer which extends over said potential control means and the other of said transistor and said diode,
   wherein said photoconversion section is formed in a monocrystal grown from a nucleus produced in a nucleus-forming region on said insulation layer, said nucleus-forming region having a sufficiently small area so as to form only one nucleus to be grown into a single monocrystal through crystal growth thereon, and said nucleus-forming area being made from material different from said insulation layer, which material has a nucleus-forming density larger than that of said insulation layer.

22. A photoelectric conversion device according to claim 8, further comprising:
   an insulating layer which extends over said third semiconductor region and said transistor,
   wherein said upper region is formed in a monocrystal grown from a nucleus produced in a nucleus-forming region on said insulation layer, said nucleus-forming region having a sufficiently small area so as to form only one nucleus to be grown into a single monocrystal through crystal growth thereon, and said nucleus-forming area being made from material different from said insulation layer, which material has a nucleus-forming density larger than that of said insulation layer.

23. A photoelectric conversion device according to claim 15, further comprising:
an insulating layer which extends over said third semiconductor region and said transistor,
wherein said photoelectric conversion section is formed in a monocrystal grown from a nucleus produced in a nucleus-forming region on said insulation layer, said nucleus-forming region having a sufficiently small area so as to form only one nucleus to be grown into a single monocrystal through crystal growth thereon, and said nucleus-forming area being made from material different from said insulation layer, which material has a nucleus-forming density larger than that of said insulation layer.

24. A photoelectric conversion device according to claim 15, wherein said electrode is electrically connected to said photoelectric conversion section.

25. A photoelectric conversion device according to claim 15, further comprising an upper part which includes said surface, a lower part beneath said upper part, and an insulation layer separating said lower part from said upper part, said transistor being on said lower part.

26. A photoelectric conversion device according to claim 15, in which said photoelectric conversion section comprises said first semiconductor region.

27. A photoelectric conversion device according to claim 15, in which said photoelectric conversion section is separate from said transistor.

28. A photoelectric conversion device according to claim 15, in which said photoelectric conversion section comprises a diode.

29. A photoelectric conversion device according to claim 28, in which said electrode is between said photoelectric conversion section and said transistor.

30. A photoelectric conversion device according to claims 1, 5, 8 or 15, in which said transistor is a bipolar transistor.

* * * * *

UNITED STATES PATENT AND TRADEMARK OFFICE
CERTIFICATE OF CORRECTION

PATENT NO. : 5,086,326
DATED : February 4, 1992
INVENTOR(S) : MAHITO SHINOHARA ET AL.

It is certified that error appears in the above-identified patent and that said Letters Patent is hereby corrected as shown below:

SHEET 8

FIG. 9, "FROW" should read --FLOW--.

COLUMN 1

Line 30, "A1" should read --Al--.
Line 38, "contact" should read --contact with--.
Line 43, "n" should read --$n^+$--.

COLUMN 2

Line 53, "desities" should read --densities--.

COLUMN 3

Line 26, "grow" should read --growth--.
Line 33, "grow" should read --growth--.

COLUMN 4

Line 8, "eliminated" should read --eliminated.--.
Line 52, "relative" should read --relative to--.

COLUMN 5

Line 2, "made" should read --receives--.
Line 9, "grow" should read --growth--.
Line 35, "deposition surface and a" should read
        --and a silicon nitride deposition surface--.
Line 36, "silicon nitride." should be deleted.

UNITED STATES PATENT AND TRADEMARK OFFICE
CERTIFICATE OF CORRECTION

PATENT NO. : 5,086,326
DATED : February 4, 1992
INVENTOR(S) : MAHITO SHINOHARA ET AL.   Page 2 of 3

It is certified that error appears in the above-identified patent and that said Letters Patent is hereby corrected as shown below:

COLUMN 6

Line 4, "SiOx" should read --$SiO_x$--.
Line 20, "grow" should read --growth--.
Line 27, "grow" should read --growth--.
Line 33, "a-large" should read --a large--.

COLUMN 7

Line 22, "X rays," should read --X-rays,--.
Line 23, "substrate 11" should read --substrate 104--.
Line 28, "tens" should read --tens of--.
Line 31, "tens" should read --tens of--.
Line 43, "tens" should read --tens of--.
Line 64, "nitride" should read --nitrides--.

COLUMN 8

Line 27, "more" should be deleted.
Line 33, "uncleation" should read --nucleation--.
Line 53, "obtainable" should read --which obtains--.

COLUMN 9

Line 33, "grow" should read --growth--.
Line 46, "nitride" should read --nitrides--.
Line 48, "follows;" should read --follows:--.
Line 54, "$SiO_2$+Si 2SiO" should read --$SiO_2$+Si$\rightarrow$2SiO--.
Line 65, "grow" should read --growth--.

COLUMN 10 line 43, "claim 14" should read --claim 2,--.

UNITED STATES PATENT AND TRADEMARK OFFICE
CERTIFICATE OF CORRECTION

PATENT NO. : 5,086,326

DATED : February 4, 1992

INVENTOR(S) : MAHITO SHINOHARA ET AL.

It is certified that error appears in the above-identified patent and that said Letters Patent is hereby corrected as shown below:

COLUMN 11

Line 1, "first-conductivity-type" should read
--first conductivity type--.
Line 4, "claim 18," should read --claim 6,--.

Signed and Sealed this

Tenth Day of August, 1993

Attest:

MICHAEL K. KIRK

Attesting Officer

Acting Commissioner of Patents and Trademarks